United States Patent
Yamamoto

(10) Patent No.: US 8,568,525 B2
(45) Date of Patent: *Oct. 29, 2013

(54) HARD COATING FILM, MATERIAL COATED WITH HARD COATING FILM, AND DIE FOR COLD PLASTIC WORKING

(75) Inventor: Kenji Yamamoto, Kobe (JP)

(73) Assignee: Kobe Steel, Ltd., Kobe-shi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/293,692

(22) Filed: Nov. 10, 2011

(65) Prior Publication Data

US 2012/0115760 A1    May 10, 2012

Related U.S. Application Data

(63) Continuation of application No. 12/168,500, filed on Jul. 7, 2008.

(30) Foreign Application Priority Data

Sep. 11, 2007   (JP) .................... 2007-235635

(51) Int. Cl.
*B23B 9/00* (2006.01)
(52) U.S. Cl.
USPC ............ 106/286.1; 106/286.4; 106/286.5; 106/286.8; 106/287.18; 106/287.19
(58) Field of Classification Search
USPC .......... 106/286.1, 286.2, 286.4, 286.5, 286.8, 106/287.18, 287.19
See application file for complete search history.

(56) References Cited

U.S. PATENT DOCUMENTS

| | | | |
|---|---|---|---|
| 5,208,102 A | 5/1993 | Schulz et al. | |
| 5,981,049 A | 11/1999 | Ohara et al. | |
| 6,617,057 B2 | 9/2003 | Gorokhovsky et al. | |
| 6,767,658 B2 | 7/2004 | Yamamoto et al. | |
| 6,811,899 B2 | 11/2004 | Inoue | |
| 7,159,640 B2 | 1/2007 | Inoue et al. | |
| 7,211,138 B2 | 5/2007 | Yamamoto et al. | |
| 7,479,331 B2 | 1/2009 | Yamamoto | |
| 7,618,719 B2 | 11/2009 | Ito et al. | |
| 7,732,066 B2 | 6/2010 | Fukui et al. | |
| 2002/0102400 A1 | 8/2002 | Gorokhovsky et al. | |

FOREIGN PATENT DOCUMENTS

| | | | |
|---|---|---|---|
| DE | 88 08 749.2 U1 | | 10/1988 |
| JP | 10-237628 | | 9/1998 |
| JP | 2000-1768 | | 1/2000 |
| JP | 2000-107905 | * | 4/2000 |
| JP | 2000-129463 | | 5/2000 |
| JP | 2000-144376 | | 5/2000 |
| JP | 2001-181826 | * | 7/2001 |
| JP | 2001-310202 | | 11/2001 |
| JP | 2002-307128 | | 10/2002 |
| JP | 2002-307129 | | 10/2002 |
| JP | 2002-371352 | | 12/2002 |
| WO | WO 02/40734 A1 | | 5/2002 |

OTHER PUBLICATIONS

Office Action issued Feb. 22, 2011, in Japan Patent Application No. 2007-235635 (with English translation).
Office Action issued Mar. 4, 2011, in German Patent Application No. 10 2008 045 269.6-45 with English translation.
Office Action issued Feb. 5, 2013 in Japanese Application No. 2011-092687 (With English Translation).

* cited by examiner

*Primary Examiner* — Archene Turner
(74) *Attorney, Agent, or Firm* — Oblon, Spivak, McClelland, Maier & Neustadt, L.L.P.

(57) ABSTRACT

Disclosed herein are a hard coating film, a material coated with the hard coating film, and a die for cold plastic working, the coating film excelling conventional surface coating layers in wear resistance as well as slidability with a low frictional coefficient.

The hard coating film is characterized by a chemical composition of $(V_xM_{1-x})(B_aC_bN_{1-a-b})$, where

| | |
|---|---|
| $0.4 \leq x \leq 0.95$ | (1A) |
| $0 \leq a \leq 0.2$ | (2A) |
| $0 \leq 1-a-b \leq 0.35$ | (3A) |
| $0.6 \leq b \leq 1$ | (4A) |

M denotes at least one species of elements belonging to Groups 4a, 5a, and 6a and Si and Al; and x, 1-x, a, b, and 1-a-b represent respectively the atomic ratio of V, M, B, C, and N.

6 Claims, No Drawings

HARD COATING FILM, MATERIAL COATED WITH HARD COATING FILM, AND DIE FOR COLD PLASTIC WORKING

CROSS-REFERENCE TO RELATED APPLICATIONS

This application is a continuation of U.S. application Ser. No. 12/168,500 filed Jul. 7, 2008, pending, and claims the benefit of Japanese patent application No. 2007-235635 filed Sep. 11, 2007, the content of which is incorporated herein by reference.

BACKGROUND OF THE INVENTION

1. Field of the Invention

The present invention belongs to the technical field relating to hard coating film, material coated with hard coating film, and die for cold plastic working. More particularly, the present invention belongs to the technical field relating to a hard coating film characterized by low frictional coefficient and excellent wear resistance and slidability.

2. Description of the Related Art

Nitriding has been a conventional way of improving the wear resistance and seize resistance of jigs and tools (such as dies) for metal working. Attempts are being made to replace it with vapor phase coating such as PVD. For example, Japanese Patent Laid-open No. 2000-144376 discloses the improvement of slidability by formation of a complex nitride containing at least two species of Cr, Al, Ti, and V. Japanese Patent Laid-open Nos. 2002-307128 and 2002-307129 disclose a surface-coated die excelling in wear resistance and seize resistance which has a coating film of nitride, carbide, or carbonitride of at least one species of Ti, V, Al, Cr, and Si and an optional second coating film of sulfide of Ti, Cr, and Mo (as remainder). Japanese Patent Laid-open No. 2000-1768 discloses a surface-treated material excelling in wear resistance and seize resistance which is composed of hard nitride and $MoS_2$ formed thereon.

Patent Document 1:
Japanese Patent Laid-open No. 2000-144376
Patent Document 2:
Japanese Patent Laid-open No. 2002-307128
Patent Document 3:
Japanese Patent Laid-open No. 2002-307129
Patent Document 4:
Japanese Patent Laid-open No. 2000-1768

OBJECT AND SUMMARY OF THE INVENTION

The complex nitride disclosed in Patent Document 1, which contains at least two species of Cr, Al, Ti, and V, has high hardness and excels in wear resistance but lacks high seize resistance and durability in use under severe conditions, such as plastic metal working at a high specific pressure. Likewise, the nitride, carbide, or carbonitride disclosed in Patent Document 2, which contains at least one species of Ti, V, Al, Cr, and Si, has high hardness but lacks seize resistance. The sulfide-coated nitride disclosed in Patent Documents 3 and 4, which was developed to improve seize resistant, is poor in long-term durability because the coating sulfide is soft (and hence initially has good slidability) and wears with time.

The present invention was completed in view of the foregoing. It is an object of the present invention to provide a hard coating film, a material coated with the hard coating film, and a die for cold plastic working, the coating film excelling the above-mentioned conventional surface coating layer in wear resistance as well as slidability with a low frictional coefficient.

In order to achieve the above-mentioned object, the present inventors carried out a series of researches, which led to the present invention. The above-mentioned object is achieved by the present invention.

The present invention, which was completed to achieve the above-mentioned object, is concerned with hard coating film, material coated with the hard coating film, and die for cold plastic working. The first to third aspects of the present invention cover a hard coating film; the fourth and fifth aspects cover a material coated with the hard coating film; and the sixth aspect covers a die for cold plastic working. The aspects of the present invention are defined as follows.

The first aspect covers a hard coating film characterized by a chemical composition of $(V_xM_{1-x})(B_aC_bN_{1-a-b})$, where $$0.4 \leq x \leq 0.95 \tag{1A}$$

$$0 \leq a \leq 0.2 \tag{2A}$$

$$0 \leq 1-a-b \leq 0.35 \tag{3A}$$

$$0.6 \leq b \leq 1 \tag{4A}$$

M denotes at least one species of elements belonging to Groups 4a, 5a, and 6a and Si and Al; and x, 1-x, a, b, and 1-a-b represent respectively the atomic ratio of V, M, B, C, and N.

The second aspect covers a hard coating film characterized by a chemical composition of $(V_xTi_{1-x-y}M_y)(C_bN_{1-b})$, where $$0.4 \leq x \leq 0.95 \tag{1B}$$

$$0 \leq y \leq 0.15 \tag{2B}$$

$$0.9 \leq b \leq 1 \tag{3B}$$

M denotes at least one species of elements (other than Ti) belonging to Groups 4a, 5a, and 6a and Si and Al; and x, 1-x-y, y, b, and 1-b represent respectively the atomic ratio of V, Ti, M, C, and N.

The third aspect covers a hard coating film which comprises one or more layers of coating film A defined below and one or more layers of coating film B defined below.

Coating film A, which has a chemical composition of $V(B_aC_bN_{1-a-b})$, where $$0 \leq a \leq 0.2 \tag{1C}$$

$$0 \leq 1-a-b \leq 0.35 \tag{2C}$$

$$0.6 \leq b \leq 1 \tag{3C}$$

a, b, and 1-a-b represent respectively the atomic ratio of B, C, and N.

Coating film B, which has a chemical composition of $M(B_aC_bN_{1-a-b})$, where $$0 \leq a \leq 0.2 \tag{1D}$$

$$0 \leq 1-a-b \leq 0.35 \tag{2D}$$

$$0.6 \leq b \leq 1 \tag{3D}$$

M denotes at least one species of elements belonging to Groups 4a, 5a, and 6a and Si and Al; and a, b, and 1-a-b represent respectively the atomic ratio of B, C, and N.

The fourth aspect covers a material coated with hard coating film which comprises a substrate and a hard coating film formed on the surface thereof, the hard coating film being the one defined in any of the first to third aspects.

The fifth aspect covers a material coated with hard coating film which comprises a substrate consisting of ferrous alloy, a first layer of hard coating film formed on the surface of the substrate, and a second layer of hard coating film formed on the first layer, said first layer of hard coating film being a nitride of at least one species of Cr, Ti, Al, and Si, and said second layer of hard coating film being the one defined in any of the first to third aspects.

The sixth aspect covers a die for cold plastic working made of the material coated with hard coating film as defined in the fourth or fifth aspect.

The hard coating film according to the present invention excels conventional surface coating layers in wear resistance and slidability (with a low frictional coefficient). It is suitably applied to dies, jigs, and tools for their improvement in durability. The material coated with hard coating film according to the present invention excels in wear resistance and slidability (with a low frictional coefficient), and it is suitable for use as dies, jigs, and tools with improved durability. The die for cold plastic working according to the present invention excels in wear resistance and slidability (with a low frictional coefficient), and it exhibits good durability.

DETAILED DESCRIPTION OF THE PREFERRED EMBODIMENTS

The First Aspect of the Invention

The hard coating film according to the present invention should contain V (as an essential element that oxidizes with heating under pressure at the time of sliding, thereby forming a lubricating oxide), at least one species of elements belonging to Groups 4a, 5a, and 6a and Si and Al in an atomic ratio up to 0.6 (which contribute to high hardness), and C in an atomic ratio not less than 0.6 (which further improves lubricity).

The hard coating film according to the present invention is defined by several numerical values as explained below.

The hard coating film should contain V as an essential element, which forms a lubricating oxide ($V_2O_5$) due to sliding, thereby reducing the frictional coefficient and the amount of wear. The content of V (in terms of atomic ratio x) should be no lower than 0.4, preferably no lower than 0.5. Its upper limit depends on the content of M (or additional elements), which is 1-x. The additional elements are expected to increase the hardness of the coating film by producing a carbide having a lattice constant different from that of VC. The value of 1-x should be no less than 0.05, preferably no less than 0.3. The upper limit of 1-x is 0.6, which is determined by the lower limit (0.4) of V. The upper limit of x is 0.95, which is determined by the lower limit of 1-x (0.05) of M. Incidentally, M is at least one species of elements belonging to Groups 4a, 5a, and 6a and Si and Al. More than one specifies of these elements may be added simultaneously. Their carbides have the lattice constants as shown in Table 4.

The hard coating film may or may not contain B, which combines with metallic elements (M) to form hard compounds, such as $TiB_2$, or with nitrogen (if present) to form a lubricating substance, such as BN. However, excess B remains free without reaction with metallic elements and nitrogen, thereby making the hard coating film decrease in hardness. The upper limit of B content (in terms of atomic ratio a) should be 0.2. In addition, the hard coating film may or may not contain nitrogen to form nitrides superior to carbides in heat resistance. Thus, nitrogen improves wear resistance for sliding at high temperatures but increases the frictional coefficient. The upper limit of N content (in terms of atomic ratio 1-a-b) should be 0.35, preferably 0.2. The hard coating film should contain C, which imparts lubricity. The content of C (in terms of atomic ratio b) should be no less than 0.6, preferably no less than 0.8.

The hard coating film according to the first aspect of the present invention has the composition based on the foregoing. Therefore, it excels in conventional surface coating film in wear resistance and slidability (with a low frictional coefficient), and it will be applied to dies, jigs, and tools for their improvement in durability.

The Second Aspect of the Invention

It is desirable that the hard coating film always contain Ti as one of the elements represented by M and the content (b) of C is no lower than 0.9. This is due to the fact that Ti combines with C to form TiC, which is hardest (ca. 3500 Hv) among carbides of M. The resulting TiC enhances hardness and wear resistance through solid solution effect owing to difference in lattice constant. The hard coating film will have an increased hardness due to solid solution effect even if it contains more than one species of elements belonging to Groups 4a, 5a, and 6a and Si and Al (excluding Ti). In this case, the content of M (in terms of atomic ratio y) should not exceed 0.15, and preferred species of M are Si, Cr, and W.

The hard coating film according to the second aspect of the present invention has the structure as mentioned above. It excels conventional hard coating film in wear resistance and slidability (with a low frictional coefficient) and it will find use in the area of dies, jigs, and tools for improved durability.

The Third Aspect of the Invention

Multiple lamination of a film of VBCN and a film of MBCN gives rise to a film of (V,M)(BCN) as a whole. This principle realizes the structure of the hard coating film according to the third aspect of the present invention as mentioned above. Individual films for lamination are not restricted in thickness, but an adequate thickness is no larger than 50 nm. The laminate film should preferably be composed of VC layers and TiC layers. The hard coating film according to the third aspect of the present invention excels conventional hard coating film in wear resistance and slidability (with a low frictional coefficient) and it will find use in the area of dies, jigs, and tools for improved durability.

The Fourth Aspect of the Invention

The fourth aspect of the present invention covers a material which is composed of a substrate and a hard coating film covering the surface thereof, the latter being the one according to the first to third aspects of the present invention. The coated material excels in wear resistance and slidability (with a low frictional coefficient), and it will find use in the area of dies, jigs, and tools for improved durability.

The Fifth Aspect of the Invention

The coated material according to the present invention is based on the finding that the hard coating film according to the first to third aspects of the present invention firmly adheres to a substrate of ferrous alloy if the substrate and the coating film are joined together by an underlying layer interposed between them which is a nitride of at least one species Cr, Ti, Al, and Si. The underlying layer should preferably be that of CrN or TiN for good adhesion. Moreover, the underlying layer should have a thickness no smaller than 0.1 μm, preferably no smaller than 1 μm. However, a thickness exceeding 10 μm does not produce additional effect. The coated material excels in wear resistance and slidability (with a low frictional coefficient), and it will find use in the area of dies, jigs, and tools for improved durability.

The Sixth Aspect of the Invention

The die for cold plastic working according to the sixth aspect of the present invention is made of the coated material according to the fourth and fifth aspects of the present invention. The die excels in wear resistance and slidability (with a low frictional coefficient), and it will find use in the area where improved durability is required.

EXAMPLES

The invention will be described in more detail with reference to the following Examples and Comparative Examples, which are not intended to restrict the scope thereof but may be changed and modified within the scope thereof.

Example 1

A substrate is coated by vapor deposition with a film having the composition shown in Tables 1 to 2. Vapor deposition is carried out in a film-forming apparatus provided with a target containing V and M (metallic element) and optional B. For the coating film to be tested for slidability at high temperatures, the substrate is previously coated with an underlying layer of CrN (about 3 μm thick) for good adhesion of the top hard coating film.

The substrate is either a cemented carbide plate (with mirror finish) or an SKD11 plate (with a hardness of HRC60). The former is used to form thereon a coating film to be examined for composition and hardness. The latter is used to form thereon a coating film for sliding test at high temperatures. They are formed in the same way as follows. The substrate plate is placed in the chamber of the film-forming apparatus. The chamber is evacuated (lower than $1 \times 10^{-3}$ Pa), and the substrate is heated to about 400° C. The hot substrate undergoes bombardment with Cr metal ions for 2 minutes. The arc current for bombardment is 100 A, and the applied bias is 700 V. This step is followed by deposition from an arc vapor source under the following conditions.

Target: 100 mm in diameter

Arc current: 150 A

Atmosphere: methane or a mixture of methane and nitrogen at a total pressure of 1.3-2.6 Pa The samples thus prepared are examined for film composition, film hardness, and surface roughness (Ra). They are also tested for wear resistance and frictional coefficient at high temperatures.

The film composition is determined by EPMA. The film hardness is measured with a microvickers hardness meter with a load of 0.25 N. The surface roughness (Ra) is measured with a surface roughness meter. The slide test at high temperatures is conducted under the following conditions.

Apparatus: slide tester of vane-on-disk type

Vane: SKD 61 steel (HRC 50), 3.5×5 mm, 20 mm long, tip radius of 10R

Disk: SKD 11 steel (HRC 60), with coating film

Sliding speed: 0.2 m/sec

Load: 500 N

Sliding distance: 1000 m

Testing temperature: 25° C. (without heating), 400° C.

The results of the tests are shown in Tables 1 and 2. The composition is expressed in terms of atomic ratio. It is apparent from Tables 1 and 2 that good slidability (with a low frictional coefficient) and good wear resistance (with shallow wear) are better achieved in Samples Nos. 6a, 6b, 7, 8, 10 to 19, 21 to 24, and 27 to 30 than in Comparative Samples Nos. 1 to 5, 9, 20, 25, and 26. Incidentally, Samples Nos. 6a, 6b, 7, 8, 21, and 22 accord with the second aspect of the present invention.

Example 2

A substrate is coated by vapor deposition with a film of laminated structure (or multilayered structure). Vapor deposition is carried out in a film-forming apparatus provided with a target containing V and M (metallic element) and optional B. For the coating film to be tested for slidability at high temperatures, the substrate is previously coated with an underlying layer of TiN (about 2 μm thick) for good adhesion of the top hard coating film. Finally, the top coating having the composition shown in Table 3 is formed.

The substrate is either a cemented carbide plate (with mirror finish) or an SKD11 plate (with a hardness of HRC60). The former is used to form thereon a coating film to be examined for composition and hardness. The latter is used to form thereon a coating film for sliding test at high temperatures. They are formed in the same way as follows. The substrate plate is placed in the chamber of the film-forming apparatus. The chamber is evacuated (lower than $1 \times 10^{-3}$ Pa), and the substrate is heated to about 400° C. The hot substrate undergoes bombardment with Cr metal ions for 2 minutes. The arc current for bombardment is 100 A, and the applied bias is 700 V. This step is followed by deposition from an arc vapor source under the following conditions.

Target: 100 mm in diameter

Arc current: 150 A

Atmosphere: methane or a mixture of methane and nitrogen at a total pressure of 1.3-2.6 Pa The samples thus prepared are examined for film composition, film hardness, and surface roughness (Ra) in the same way as in Example 1. They are also tested for wear resistance and frictional coefficient at high temperatures.

The results of the tests are shown in Table 3. The multilayered film is composed of layer A and layer B formed alternately. It starts with layer A and ends with layer B. The number of layers is expressed as (number of layer A+number of layer B)/2. The total film thickness is the entire thickness of the laminated films. The composition of layer A and layer B is expressed in terms of atomic ratio. For example, TiC0.9N0.1 implies that Ti, C, and N respectively have an atomic ratio of 1, 0.9, and 0.1, and Ti0.9Si0.1 implies that Ti and Si have an atomic ratio of 0.9 and 0.1, respectively.

It is apparent from Table 3 that good slidability (with a low frictional coefficient) and good wear resistance (with shallow wear) are better achieved in Samples Nos. 1 to 10 than in Comparative Samples Nos. 1 to 5, 9, 20, 25, and 26 (shown in Table 1).

TABLE 1

| No | Film composition (amount of components) (atomic ratio) | | | | | | Film thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|
| | V | Species of M | Amount of M | B | C | N | | | | | | |
| 1 | | TiN (CVD process) | | | | | 5000 | 22 | 0.55 | 0.55 | 3.00 | >5 μm (film worn out) |
| 2 | | TiC (CVD process) | | | | | 5000 | 30 | 0.54 | 0.4 | 3.00 | >5 μm (film worn out) |
| 3 | | VC (diffusion process) | | | | | 5000 | 32 | 0.5 | 0.4 | 3.00 | >5 μm (film worn out) |
| 4 | 1 | — | 0 | 0 | 1 | 0.00 | 5000 | 32 | 0.5 | 0.4 | 2.50 | >5 μm (film worn out) |
| 5 | 0.97 | Ti | 0.03 | 0 | 1 | 0.00 | 5000 | 32 | 0.45 | 0.4 | 2 | 4.50 |
| 6a | 0.95 | Ti | 0.05 | 0 | 1 | 0.00 | 5000 | 34 | 0.36 | 0.26 | 1.2 | 2.60 |
| 6b | 0.9 | Ti | 0.1 | 0 | 1 | 0.00 | 5000 | 35 | 0.35 | 0.25 | 1 | 2.50 |
| 7 | 0.7 | Ti | 0.3 | 0 | 1 | 0.00 | 5000 | 36 | 0.3 | 0.15 | 0.5 | 2.00 |
| 8 | 0.4 | Ti | 0.6 | 0 | 1 | 0.00 | 5000 | 37 | 0.3 | 0.2 | 0.2 | 1.50 |
| 9 | 0.1 | Ti | 0.9 | 0 | 1 | 0.00 | 5000 | 33 | 0.5 | 0.4 | 3 | >5 μm (film worn out) |
| 10 | 0.5 | Zr | 0.5 | 0 | 1 | 0.00 | 5000 | 34 | 0.35 | 0.25 | 1.5 | 2.50 |
| 11 | 0.5 | Hf | 0.5 | 0 | 1 | 0.00 | 5000 | 35 | 0.4 | 0.3 | 2 | 2.20 |
| 12 | 0.5 | Ta | 0.5 | 0 | 1 | 0.00 | 5000 | 34 | 0.3 | 0.2 | 1.7 | 1.90 |
| 13 | 0.5 | Mo | 0.5 | 0 | 1 | 0.00 | 5000 | 34 | 0.35 | 0.3 | 2.1 | 2.40 |
| 14 | 0.5 | Si | 0.5 | 0 | 1 | 0.00 | 5000 | 33.5 | 0.35 | 0.3 | 2.2 | 2.00 |
| 15 | 0.5 | Al | 0.5 | 0 | 1 | 0.00 | 5000 | 34 | 0.4 | 0.25 | 1.9 | 2.60 |

TABLE 2

| No | Film composition (amount of components) (atomic ratio) | | | | | | Film thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|
| | V | Species of M | Amount of M | B | C | N | | | | | | |
| 16 | 0.5 | Ti0.25Nb0.25 | 0.5 | 0 | 1 | 0.00 | 5000 | 38 | 0.3 | 0.2 | 0.30 | 1.70 |
| 17 | 0.5 | Ti0.25Ta0.25 | 0.5 | 0 | 1 | 0.00 | 5000 | 38 | 0.3 | 0.15 | 0.25 | 1.60 |
| 18 | 0.5 | Ti | 0.5 | 0.1 | 0.9 | 0.00 | 5000 | 38 | 0.3 | 0.1 | 0.5 | 2.00 |
| 19 | 0.5 | Ti | 0.5 | 0.2 | 0.8 | 0.00 | 5000 | 37 | 0.3 | 0.12 | 0.70 | 2.20 |
| 20 | 0.5 | Ti | 0.5 | 0.3 | 0.75 | 0.00 | 5000 | 33 | 0.5 | 0.25 | 2.7 | 4.10 |
| 21 | 0.5 | Ti | 0.5 | 0 | 1 | 0.00 | 5000 | 37.5 | 0.25 | 0.1 | 0.3 | 1.00 |
| 22 | 0.5 | Ti | 0.5 | 0 | 0.9 | 0.10 | 5000 | 37 | 0.3 | 0.15 | 0.4 | 1.30 |
| 23 | 0.5 | Ti | 0.5 | 0 | 0.8 | 0.20 | 5000 | 36 | 0.35 | 0.2 | 0.7 | 1.40 |
| 24 | 0.5 | Ti | 0.5 | 0 | 0.65 | 0.35 | 5000 | 35 | 0.4 | 0.3 | 0.9 | 1.60 |
| 25 | 0.5 | Ti | 0.5 | 0 | 0.6 | 0.40 | 5000 | 31 | 0.55 | 0.45 | 2.3 | 4.00 |
| 26 | 0.5 | Ti | 0.5 | 0 | 0.5 | 0.50 | 5000 | 32 | 0.6 | 0.5 | 3.00 | >5 μm (film worn out) |
| 27 | 0.5 | Ti0.45SSi0.05 | 0.5 | 0 | 1 | 0.00 | 5000 | 38 | 0.2 | 0.1 | 0.25 | 0.70 |
| 28 | 0.5 | Ti0.4Cr0.1 | 0.5 | 0 | 1 | 0.00 | 5000 | 37 | 0.2 | 0.15 | 0.3 | 0.70 |
| 29 | 0.5 | Ti0.4W0.1 | 0.5 | 0 | 1 | 0.00 | 5000 | 38 | 0.25 | 0.1 | 0.25 | 0.80 |
| 30 | 0.5 | Ti0.35Al0.15 | 0.5 | 0 | 1 | 0.00 | 5000 | 36 | 0.3 | 0.2 | 0.4 | 1.20 |

TABLE 3

| No | Layer B Composition | Layer B Layer thickness nm | Layer B Number of layers | Layer A Composition | Layer A Layer thickness nm | Layer A Number of layers | Type | Total film thickness nm | Hardness GPa | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|---|
| 1 | TiC | 5 | 500 | VC | 5 | 500 | Multi-layered film | 5000 | 37 | 0.3 | 0.2 | 0.90 | 1.20 |
| 2 | TiC | 20 | 125 | VC | 20 | 125 | Multi-layered film | 5000 | 38 | 0.3 | 0.1 | 0.70 | 1.50 |
| 3 | TiC | 500 | 5 | VC | 500 | 5 | Multi-layered film | 5000 | 36 | 0.25 | 0.1 | 0.80 | 1.70 |

TABLE 3-continued

| | Layer B | | | Layer A | | | Total film | | Frictional coefficient (25° C.) 100-300 m on average | Frictional coefficient (400° C.) 100-300 m on average | Depth of film wear (25° C.) μm | Depth of film wear (400° C.) μm |
|---|---|---|---|---|---|---|---|---|---|---|---|---|
| No | Composition | Layer thickness nm | Number of layers | Composition | Layer thickness nm | Number of layers | Type | thickness nm | Hardness GPa | | | | |
| 4 | TiC | 1000 | 2 | VC | 1000 | 2 | Multi-layered film | 5000 | 36 | 0.25 | 0.15 | 1.20 | 2.00 |
| 5 | TiC | 2500 | 1 | VC | 2500 | 1 | Multi-layered film | 5000 | 35 | 0.3 | 0.2 | 0.5 | 2.50 |
| 6 | TiC0.9N0.1 | 20 | 125 | VC | 20 | 125 | Multi-layered film | 5000 | 38 | 0.35 | 0.15 | 0.6 | 1.20 |
| 7 | TiC | 20 | 125 | VB0.05C0.95 | 20 | 125 | Multi-layered film | 5000 | 38 | 0.25 | 0.1 | 0.65 | 1.10 |
| 8 | Ti0.9Si0.1C | 20 | 125 | VC | 20 | 125 | Multi-layered film | 5000 | 37 | 0.3 | 0.1 | 0.5 | 1.10 |
| 9 | Ti0.5Cr0.5C | 20 | 125 | VC | 20 | 125 | Multi-layered film | 5000 | 37 | 0.3 | 0.1 | 0.7 | 1.00 |
| 10 | WC | 20 | 125 | VC | 20 | 125 | Multi-layered film | 5000 | 37.5 | 0.2 | 0.1 | 0.35 | 0.80 |

(note)
The first layer adjacent to the substrate is layer B.

TABLE 4

| Carbide | Lattice constant (Å) | Carbide | Lattice constant (Å) |
|---|---|---|---|
| VC | 4.164 | TaC | 4.454 |
| TiC | 4.327 | CrC | 4.03 |
| ZrC | 4.693 | MoC | 4.273 |
| HfC | 4.637 | WC | 4.235 |
| NbC | 4.469 | SiC | 4.358 |

The hard coating film according to the present invention excels in conventional surface coating film in wear resistance and slidability (with a low frictional coefficient), and it will be applied to dies, jigs, and tools for their improvement in durability. The coated material according to the present invention excels in wear resistance and slidability (with a low frictional coefficient), and it will find use in the area of dies, jigs, and tools for improved durability. The die for cold plastic working according to the present invention excels in wear resistance and slidability (with a low frictional coefficient), and it will find use in the area where improved durability is required.

What is claimed is:

1. A hard coating film consisting of a chemical composition of $(V_xM_{1-x})(B_aC_bN_{1-a-b})$, where $$0.4 \leq x \leq 0.95 \quad (1A)$$

$$0 \leq a \leq 0.2 \quad (2A)$$

$$0 < 1-a-b \leq 0.2 \quad (3A)$$

$$0.8 \leq b < 1 \quad (4A)$$

M denotes at least one species of elements selected from the group consisting of Zr, Nb, Hf, Ta, and Si; and x, 1-x, a, b, and 1-a-b represent respectively the atomic ratio of V, M, B, C, and N.

2. A hard coating film consisting of a chemical composition of $(V_xTi_{1-x-y}M_y)(C_bN_{1-b})$, where $$0.4 \leq x \leq 0.95 \quad (1B)$$

$$0 \leq y \leq 0.15 \quad (2B)$$

$$0.9 \leq b < 1 \quad (3B)$$

M denotes at least one species of elements (other than Ti) selected from the group consisting of V, Zr, Nb, Hf, Ta, and Si; and x, 1-x-y, y, b, and 1-b represent respectively the atomic ratio of V, Ti, M, C, and N.

3. A hard coating film which comprises one or more layers of coating film A and one or more layers of coating film B wherein Coating film A consists of a chemical composition of $V(B_aC_bN_{1-a-b})$, where $$0 \leq a \leq 0.2 \quad (1C)$$

$$0 < 1-a-b \leq 0.35 \quad (2C)$$

$$0.6 \leq b < 1 \quad (3C)$$

a, b, and 1-a-b represent respectively the atomic ratio of B, C, and N, and wherein Coating film B consists of a chemical composition of $M(B_aC_bN_{1-a-b})$, where $$0 \leq a \leq 0.2 \quad (1D)$$

$$0 \leq 1-a-b \leq 0.2 \quad (2D)$$

$$0.8 \leq b \leq 1 \quad (3D)$$

M denotes at least one species of elements belonging to Groups 4a, 5a, and 6a and Si and Al, with the proviso that M is not V or W; and a, b, and 1-a-b represent respectively the atomic ratio of B, C, and N.

4. The hard coating film according to claim 1, where $$0.4 \leq x \leq 0.95 \quad (1A)$$

$$0 < a \leq 0.2 \quad (2A)$$

$$0 < 1-a-b \leq 0.2 \quad (3A)$$

$$0.8 \leq b < 1 \quad (4A)$$

M denotes at least one species of elements selected from the group consisting of Zr, Nb, Hf, Ta, and Si; and x, 1-x, a, b, and 1-a-b represent respectively the atomic ratio of V, M, B, C, and N.

5. The hard coating film according to claim 2, where $$0.4 \leq x \leq 0.95 \quad (1B)$$

$$0 < y \leq 0.15 \quad (2B)$$

$$0.9 \leq b < 1 \quad (3B)$$

M denotes at least one species of elements (other than Ti) selected from the group consisting of V, Zr, Nb, Hf, Ta, and Si; and x, 1-x-y, y, b, and 1-b represent respectively the atomic ratio of V, Ti, M, C, and N.

6. The hard coating film according to claim 3, wherein Coating film A consists of a chemical composition of $V(B_aC_bN_{1-a-b})$, where $$0 < a \leq 0.2 \quad (1C)$$

$$0 < 1-a-b \leq 0.35 \quad (2C)$$

$$0.6 \leq b < 1 \quad (3C)$$

a, b, and 1-a-b represent respectively the atomic ratio of B, C, and N, and wherein Coating film B consists of a chemical composition of $M(B_aC_bN_{1-a-b})$, where $$0 < a \leq 0.2 \quad (1D)$$

$$0 < 1-a-b \leq 0.2 \quad (2D)$$

$$0.8 \leq b \leq 1 \quad (3D)$$

M denotes at least one species of elements selected from the group consisting of Zr, Nb, Hf, Ta, Si and Al; and a, b, and 1-a-b represent respectively the atomic ratio of B, C, and N.

* * * * *